United States Patent
Windlass et al.

(10) Patent No.: US 6,974,984 B2
(45) Date of Patent: Dec. 13, 2005

(54) METHOD TO SPUTTER DEPOSIT METAL ON A FERROELECTRIC POLYMER

(75) Inventors: Hitesh Windlass, Hillsboro, OR (US); Ebrahim Andideh, Portland, OR (US); Daniel C. Diana, Portland, OR (US); Mark Richards, Tigard, OR (US); William C. Hicks, Gaston, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 10/749,500

(22) Filed: Dec. 31, 2003

(65) Prior Publication Data

US 2005/0145907 A1 Jul. 7, 2005

(51) Int. Cl.⁷ .............................................. H01L 29/76
(52) U.S. Cl. .................... 257/295; 257/40; 257/298; 257/410; 438/3; 438/239; 438/240; 204/192.17
(58) Field of Search .................. 257/40, 295, 298, 257/410; 438/3, 239, 240; 204/192.17

(56) References Cited

U.S. PATENT DOCUMENTS

| | | | |
|---|---|---|---|
| 6,582,569 B1 * | 6/2003 | Chiang et al. | 204/192.17 |
| 6,812,509 B2 * | 11/2004 | Xu | 257/295 |
| 6,878,980 B2 * | 4/2005 | Gudesen et al. | 257/295 |
| 2004/0209420 A1 * | 10/2004 | Ljungcrantz et al. | |

* cited by examiner

Primary Examiner—David Nelms
Assistant Examiner—Mai-Huong Tran
(74) Attorney, Agent, or Firm—Blakely, Sokoloff, Taylor & Zafman LLP

(57) ABSTRACT

Methods of depositing various metal layers adjacent to a ferroelectric polymer layer are disclosed. In one embodiment, a collimator may be used during a sputtering process to filter out charged particles from the material that may be deposited as a metal layer. In various embodiments, a metal layer may contain at least one of an intermetallic layer, an amorphous intermetallic layer, and an amorphized intermetallic layer.

14 Claims, 4 Drawing Sheets

METHOD TO SPUTTER DEPOSIT METAL ON A FERROELECTRIC POLYMER

FIELD

The embodiments disclosed herein relate generally to formation of metal layers on ferroelectric polymer material.

BACKGROUND

There are many useful applications for ferroelectric materials, which have the ability to achieve and maintain a high degree of polarization (e.g., alignment of the atomic or molecular dipoles that comprise the material) even in the absence of an external electric field. For example, highly polarized material may be used in computer memory cells. In such an application, metal electrode layers may be formed on a ferroelectric polymer layer.

Although sputter deposition may be generally used to form metal layers, sputtering does not typically work well when forming metal layers on ferroelectric polymer material due to the fact that conventional sputtering may cause ferroelectric property degradation, which may render the polymer useless.

One method of forming the metal electrode layers includes evaporation (e.g., by resistive heating) of the metal to form a metal layer on the ferroelectric polymer layer. However, evaporation of metal may not be reliably reproducible and may result in higher defect density within the metal layer, which may cause a lower yield for the process. Moreover, certain materials (e.g., intermetallics such as TiN, TaN, TiNSi, and TaNSi) may not be successfully deposited via metal evaporation.

DESCRIPTION OF THE DRAWINGS

Various embodiments are illustrated by way of example and not by way of limitation in the figures of the accompanying drawings in which like references indicate similar elements. It should be noted that references to "an," "one," "the," "other," "another," "alternative," or "various" embodiments in this disclosure are not necessarily to the same embodiment, and such references mean at least one.

DETAILED DESCRIPTION

The following description and the accompanying drawings provide examples for the purposes of illustration. However, these examples should not be construed in a limiting sense as they are not intended to provide an exhaustive list of all possible implementations.

Figure 1:
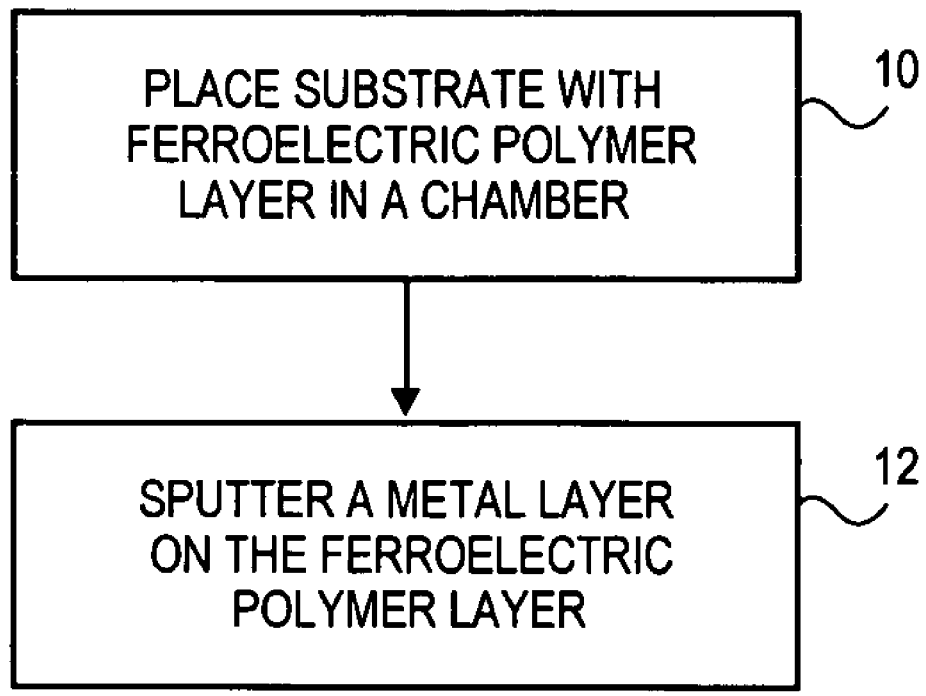
FIG. 1 is a flow chart of one embodiment of a method of forming a metal layer on a ferroelectric polymer layer.

Referring now to FIG. 1, a flow chart for a method of forming a metal layer on a ferroelectric polymer layer is shown. At block 10, a substrate with a ferroelectric polymer layer formed thereon may be placed in a chamber. In various embodiments, the chamber may include, for example, a physical vapor deposition ("PVD") chamber. A metal layer is then sputtered on the ferroelectric polymer layer of the substrate, at block 12.

Figure 2A:
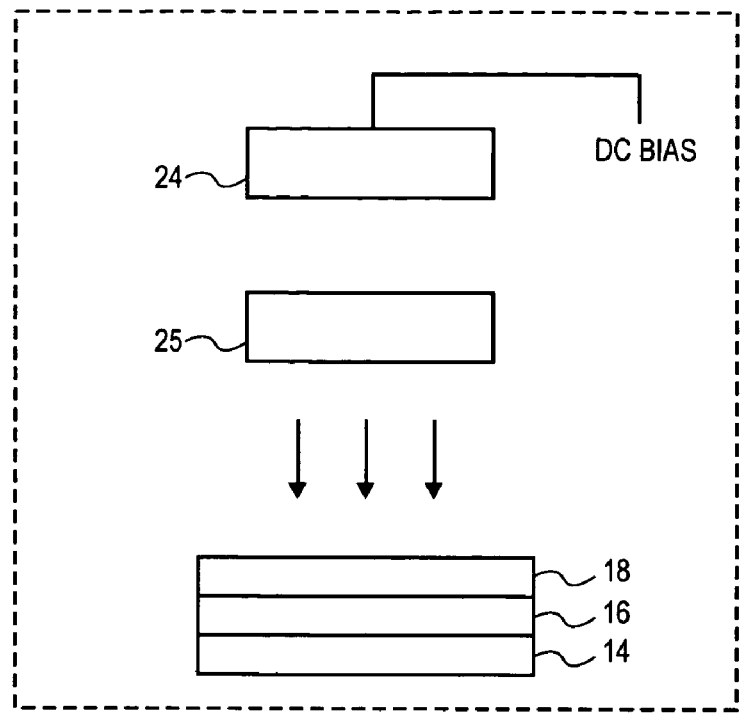
FIG. 2A shows one embodiment of an internal chamber configuration that may be used to sputter a layer on a ferroelectric polymer layer.

FIG. 2A shows one example of an internal configuration of a chamber (e.g., a PVD chamber) used during sputtering. As shown, a work piece, including both metal layer 14 and ferroelectric polymer layer 16, may be introduced into the chamber. Material for metal layer 18 is sputtered from target 25.

In one embodiment, a sputter deposition environment may include a species flux reducer that reduces the flux of material (e.g., ions, atoms, etc.) that contacts a ferroelectric polymer layer of a substrate. Representatively, the chamber shown in FIG. 2A may include species-flux reducer 24, such as a collimator or similar structure, which, in one embodiment, may optionally be linked to a charge source (e.g., a DC bias) to filter out charged particles, which may damage ferroelectric polymer layer 16 if not neutralized.

Flux reducer 24 tends to limit the flux of material/particles that contacts ferroelectric polymer layer 16 (e.g., a physical limitation on species that contact ferroelectric polymer layer 16 at any one time). By limiting the dose of material/particles that contact ferroelectric polymer layer 16 at any one time (e.g., the sum of ions, atoms, etc. per area), degradation of ferroelectric polymer layer 16 during a sputter deposition process may be modulated.

Figure 2B:
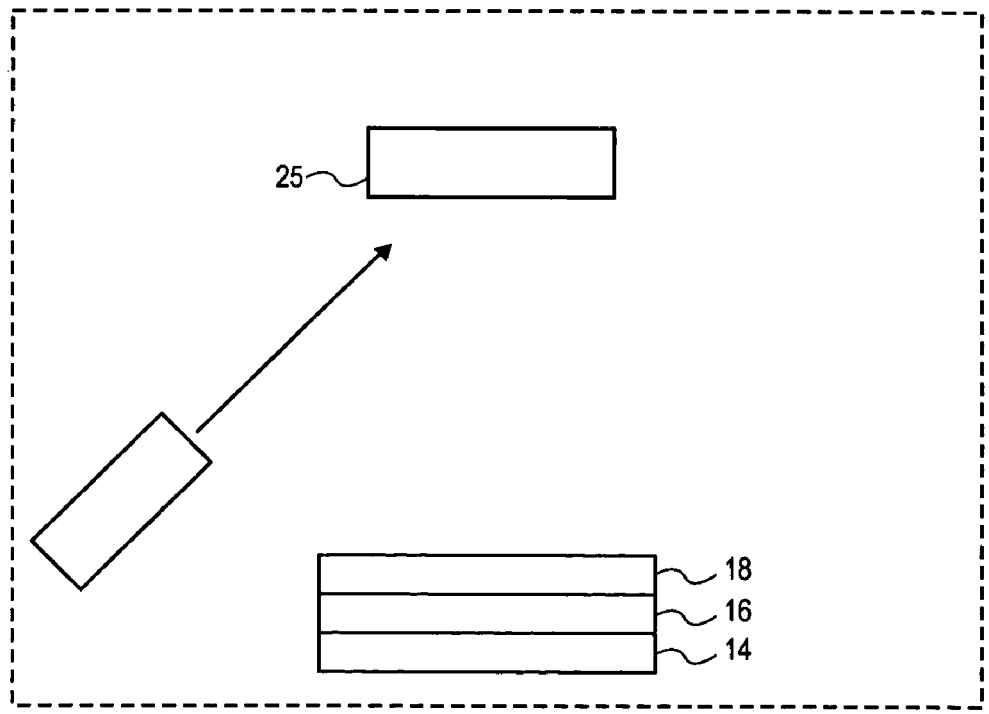
FIG. 2B shows another embodiment of an internal chamber configuration that may be used to sputter a layer on a ferroelectric polymer layer.

In one embodiment, an ion beam sputter deposition process may be employed to deposit second metal layer 18. Representatively, FIG. 2B shows ion gun 22 (e.g., which may use argon as a sputtering agent) that emits energy toward target 25 (e.g., titanium or tantalum) to cause target 25 to release material to be deposited (e.g., sputter deposition) as second metal layer 18 on ferroelectric polymer layer 16. The sputter deposition process may be conducted at a pressure of less than 10 milliTorr.

The sputter deposition process described with reference to FIG. 2A and/or FIG. 2B and the accompanying text may be altered based on the desired final composition and construction of the device upon which the metal layer (e.g., metal-containing layer that may include an intermetallic layer) is being formed. For example, nitrogen may be used as an ambient within the chamber in combination with titanium or tantalum as a target in order to form titanium nitride or tantalum nitride, respectively. Moreover, if titanium oxide is to be deposited, oxygen may be used as an ambient in combination with a titanium target.

If titanium nitride silicide or tantalum nitride silicide are to be used as the material for intermetallic layers formed on the ferroelectric polymer layer, then the target may be made of titanium silicide or tantalum silicide, respectively, in combination with a nitrogen ambient. Alternatively, silane (e.g., $SiH_4$) may be included in the nitrogen ambient with a titanium or a tantalum target to form titanium nitride silicide or tantalum nitride silicide, respectively. Although various target materials and ambient materials have been disclosed, other materials and combinations of materials may be used.

In addition, conducting sputter deposition at lower pressures may be advantageous in that a reduced particle flux the lower pressures may decrease the amount of damage inflicted upon the ferroelectric polymer layer during sputter deposition. The decrease in damage may increase the remnant polarization of the final device, which may be advantageous for many applications including, for example, ferroelectric polymer memory cells. Thus, the pressure within the sputter deposition chamber may be less than approximately 10 milliTorr ("mT") and greater than approximately 0.2 mT.

Furthermore, sputtering may be conducted at a temperature below the melting point of the ferroelectric polymer layer, which may be, for example, 120° C. However, sputtering may be performed at pressures and temperatures outside of these ranges.

As stated above, sputtering may include formation of a metal layer of at least one of titanium nitride, tantalum nitride, titanium nitride silicide, and tantalum nitride silicide. These compounds are all examples of metals combined with at least one non-metal to form an intermetallic that may be deposited directly on (e.g., adjacent to) a ferroelectric polymer layer by sputtering without degrading the ferroelectric properties of the ferroelectric polymer layer. Although specific compounds are disclosed, other intermetallic materials may be used.

Figure 3:
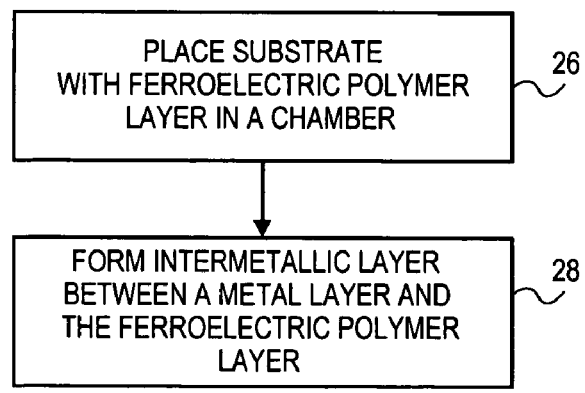
FIG. 3 is a flow chart of one embodiment of a method of forming an intermetallic layer between a metal layer and a ferroelectric polymer layer.

FIG. 3 shows a flow chart of one embodiment of a method of forming an intermetallic layer between a metal layer and a ferroelectric polymer layer. At block 26, a substrate with a ferroelectric polymer layer may be placed in a chamber (e.g., a PVD chamber). At block 28, an intermetallic layer may be formed between a metal layer and the ferroelectric polymer layer of the substrate. As described above, forming may include sputtering with an ion gun. Likewise, the intermetallic layer may comprise at least one of titanium nitride, tantalum nitride, titanium nitride silicide, and tantalum nitride silicide.

Furthermore, the intermetallic layer may be amorphized. The amorphizing may be conducted by implanting ions within the intermetallic layer or by forming the intermetallic layer with a technique that renders the intermetallic layer amorphous. If ion implantation is used, at least one of silicon ions, germanium ions, and any of the inert gas ions may be implanted into the intermetallic layer. The inert gases include, for example, helium, neon, argon, krypton, xenon, and radon. The implantation energy used may be between approximately 0.5 kilo-electron-volts ("keV") and 20 keV. The implantation dosage may be between approximately $1 \times 10^{10}$ and $5 \times 10^{13}$ ions per square centimeter. However, other species, doses, and implantation energies beyond those stated here may be used in order to accomplish the amorphizing sought by ion implantation.

Regarding amorphizing by using a technique that renders the intermetallic layer amorphous, a chemical vapor deposition process, or a similar process, may be used to deposit the intermetallic layer in an amorphous manner. However, the process used may take into account the melting point of the ferroelectric polymer material upon which the intermetallic layer is being formed. One advantage of an amorphous intermetallic layer may be the reduction of grain boundaries upon which reaction with fluorine (e.g., a common component of ferroelectric polymers) may occur.

Figure 4:
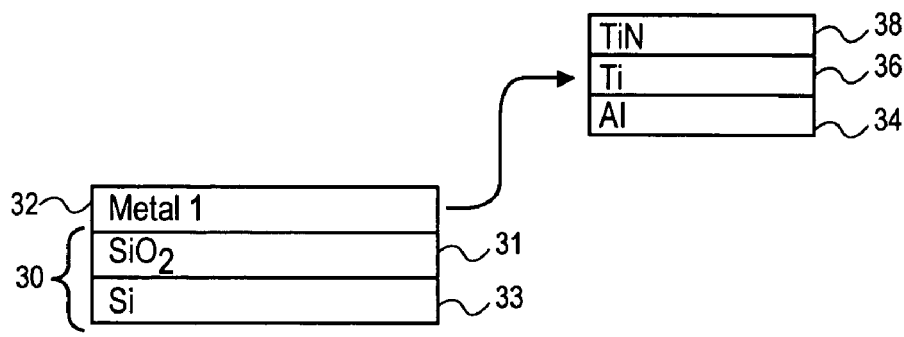
FIG. 4 shows one embodiment of a substrate with a metal layer formed thereon, including an intermetallic layer on the top of the metal stack, Metal 1.

FIGS. 4 through 8 show various embodiments of the formation of a ferroelectric polymer layer between two metal electrodes, each containing an intermetallic layer adjacent to the ferroelectric polymer material. Specifically, FIG. 4 shows substrate 30, which may include silicon layer 33 and silicon dioxide layer 31, with first metal layer 32 formed on substrate 30.

First metal layer 32 may be comprised of several layers, each of which may address specific purposes. Regardless of the number and type of layers within first metal layer 32, the top most layer (e.g., as shown) may be an intermetallic layer in order to attain the advantages described above in having an intermetallic layer adjacent to a ferroelectric polymer layer. As shown in FIG. 4, first metal layer 32 may comprise aluminum layer 34, titanium layer 36, and titanium nitride layer 38 (e.g., an intermetallic layer) at the top of first metal layer 32.

Figure 5:
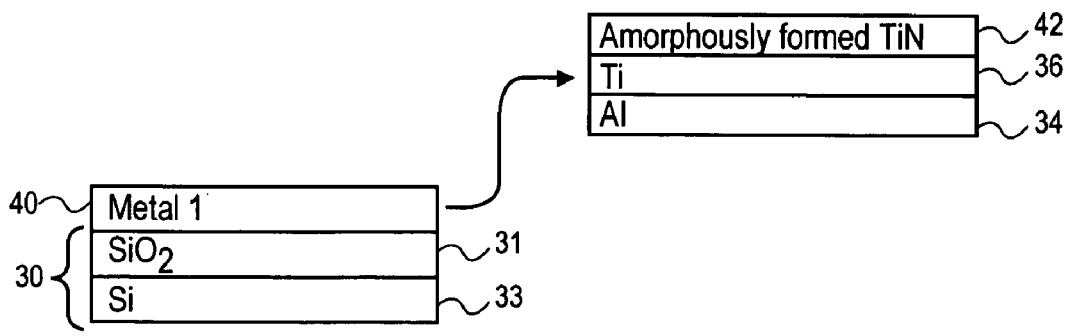
FIG. 5 shows the same substrate as shown in FIG. 4 but with a different metal stack, wherein the intermetallic layer is amorphous.

FIG. 5 shows an embodiment in which first metal layer 40, formed on substrate 30, may be different than first metal layer 32 of FIG. 4. For example, first metal layer 40 of FIG. 5 may include aluminum layer 34, titanium layer 36, and an amorphous titanium nitride layer 42. In one embodiment, an amorphous titanium nitride layer 42 may be formed by a process such as a chemical vapor deposition process rather than the sputtering process used to create titanium nitride layer 38 of FIG. 4. Thus, an amorphous formed titanium nitride layer 42 of FIG. 5 is inherently amorphous upon formation.

Figure 6:
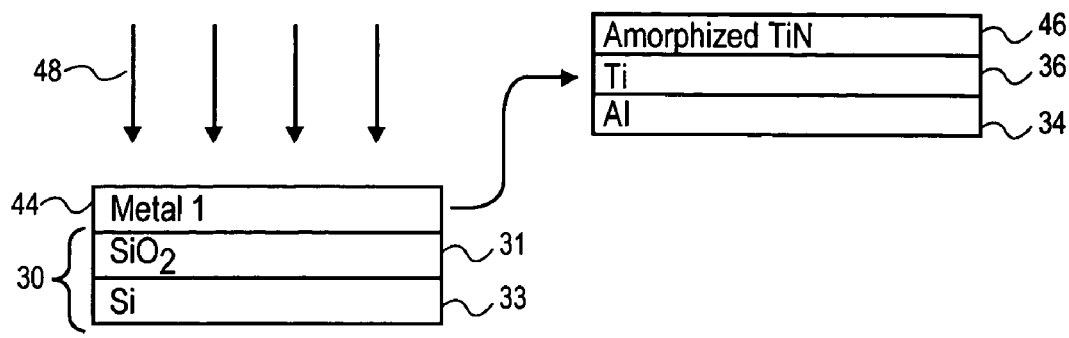
FIG. 6 shows the same substrate as shown in FIGS. 4 and 5 but with a metal stack that includes an intermetallic layer that is amorphized by ion implantation.

FIG. 6 shows an alternative embodiment in which first metal layer 44, formed on substrate 30, may include aluminum layer 34, titanium layer 36, and amorphized titanium nitride layer 46. In one embodiment, amorphized titanium nitride layer 46 may be formed by sputtering followed by ion implantation 48 to achieve the amorphized structure of amorphized titanium nitride layer 46.

Figure 7:
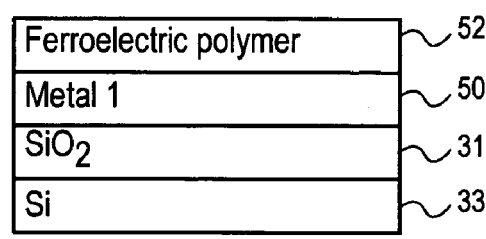
FIG. 7 shows a substrate with a metal stack formed thereon and a ferroelectric polymer layer formed on top of the metal stack, as shown.

FIG. 7 shows first metal layer 50 formed on silicon dioxide layer 31, which is formed on silicon layer 33. First metal layer 50 may include at least an intermetallic layer (e.g., titanium nitride layer 38 of FIG. 4), an amorphous intermetallic layer (e.g., amorphous titanium nitride layer 42 of FIG. 5), and/or an amorphized intermetallic layer (e.g., amorphized titanium nitride layer 46 of FIG. 6). Ferroelectric polymer layer 52 may be formed on first metal layer 50.

Figure 8:
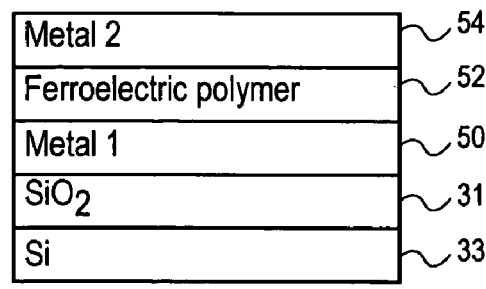
FIG. 8 shows the same construction as FIG. 7 and additionally includes another metal stack formed on the ferroelectric polymer layer.

FIG. 8 shows second metal layer 54 formed on ferroelectric polymer layer 52 of FIG. 8. Similar to the first metal layers shown in FIGS. 4–6, second metal layer 54 may be comprised of a number of different metal layers so long as the metal layer that is in direct physical contact with ferroelectric polymer layer 52 may be at least one of an intermetallic layer, an amorphized intermetallic layer, and an amorphous intermetallic layer.

After completion of processing, the substrate, metal layer (e.g., including intermetallic layer), and ferroelectric polymer layer, may be packaged as an integrated circuit. In certain applications, the integrated circuit may include both a first and second metal layer coupled to the ferroelectric polymer layer. The first and/or second metal layers may comprise at least one of titanium nitride, tantalum nitride, titanium nitride silicide, and tantalum nitride silicide. Moreover, at least a portion of the first and/or second metal layers may be amorphous either by formation or by ion implantation.

Among other applications, the embodiments disclosed herein may be used to improve the remnant polarization of polymer material used in memory cells. For example, a flash memory device may include an integrated circuit comprising a first metal layer comprising an intermetallic material and a layer of ferroelectric polymer material coupled to the first metal layer. Of course, additional metal layers may be coupled to the ferroelectric polymer material within the integrated circuit. Besides flash memory devices, the materials, devices and methods disclosed herein may be used in other memory applications, such as, for example, non-volatile random access memory, static random access memory, transducers, and actuators.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

We claim:

1. A method comprising:
    placing a substrate with a ferroelectric polymer layer formed thereon in a chamber; and
    sputtering a metal layer on the ferroelectric polymer layer in the presence of a flux reducer.

2. The method of claim 1 wherein the flux reducer comprises a collimator.

3. The method of claim 2, wherein sputtering comprises sputtering at a pressure less than approximately 10 milliTorr.

4. The method of claim 2, wherein sputtering comprises sputtering at a pressure equal to or less than approximately 2.5 milliTorr.

5. The method of claim 1, wherein sputtering comprises:
    forming a metal layer of at least one of TiN, TaN, TiNSi, and TaNSi.

6. The method of claim 1, wherein sputtering comprises:
    sputtering with an ion gun.

7. A method comprising:
    placing a substrate with a ferroelectric polymer layer formed thereon in a chamber; and
    forming an intermetallic layer between a metal layer and the ferroelectric polymer layer.

8. The method of claim 7, wherein forming comprises:
    sputtering with an ion gun.

9. The method of claim 7, wherein forming comprises:
    forming a layer of at least one of TiN, TaN, TiNSi, and TaNSi.

10. The method of claim 7, further comprising:
    amorphizing the intermetallic layer.

11. The method of claim 10, wherein amorphizing comprises:
    implanting ions within the intermetallic layer.

12. The method of claim 11, wherein implanting comprises:
    implanting at least one of Si ions, Ge ions, and any of the inert gas ions in the intermetallic layer.

13. The method of claim 10, wherein amorphizing comprises:
    forming the intermetallic layer with a technique that renders the intermetallic layer amorphous.

14. The method of claim 13, wherein forming comprises:
    forming the intermetallic layer with a chemical vapor deposition process.

* * * * *